Figure 1:
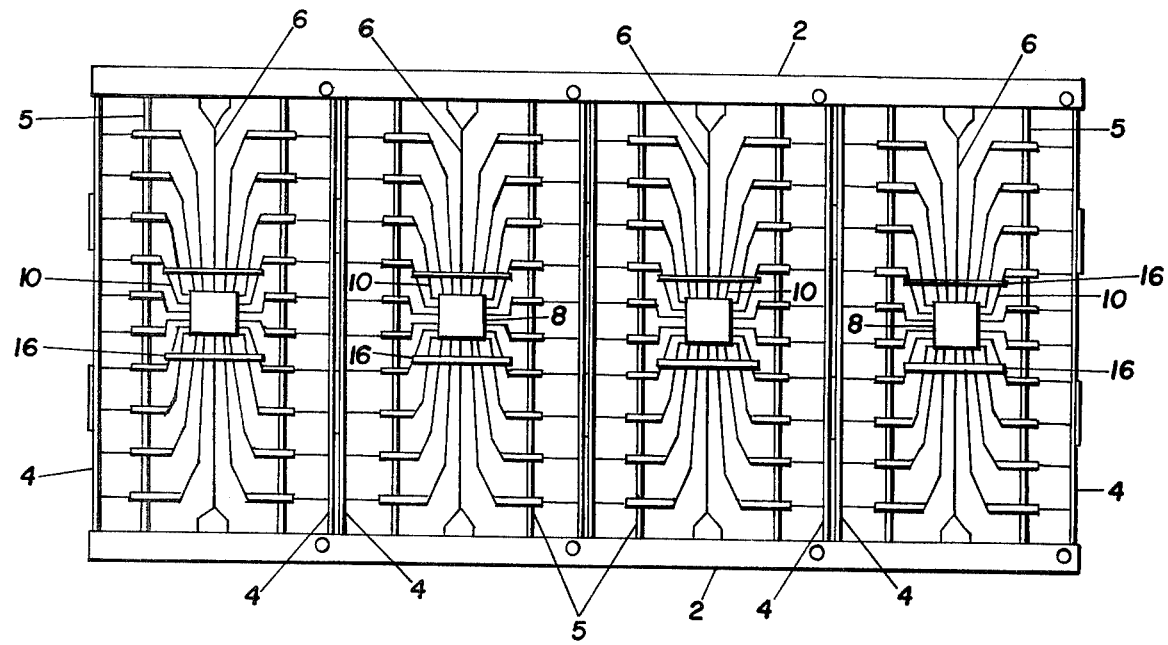

United States Patent [19]

Winn

[11] 4,204,317

[45] May 27, 1980

[54] METHOD OF MAKING A LEAD FRAME

[75] Inventor: Clarence W. Winn, San Jose, Calif.

[73] Assignee: The Arnold Engineering Company, Marengo, Ill.

[21] Appl. No.: 852,765

[22] Filed: Nov. 18, 1977

[51] Int. Cl.² ............................................. H01R 43/00
[52] U.S. Cl. ...................................... 29/827; 29/885; 29/589; 357/70
[58] Field of Search ...................... 29/576 S, 589, 627, 29/624, 630 B; 357/70; 156/630

[56] References Cited

U.S. PATENT DOCUMENTS

| | | | |
|---|---|---|---|
| 3,271,625 | 9/1966 | Caracciolo | 29/576 S |
| 3,484,533 | 12/1969 | Kauffman | 29/589 X |
| 3,544,857 | 12/1970 | Byrne et al. | 29/576 S |
| 3,689,336 | 9/1972 | Bunker et al. | 357/70 X |
| 3,778,887 | 12/1973 | Suzuki et al. | 29/627 X |
| 4,089,733 | 5/1978 | Zimmerman | 156/630 |

OTHER PUBLICATIONS

Electronics, pp. 36–37, Jul. 24, 1967.

Primary Examiner—Francis S. Husar
Assistant Examiner—C. J. Arbes
Attorney, Agent, or Firm—Vincent G. Gioia; John K. Williamson

[57] ABSTRACT

The method of making a metal lead frame wherein a metal lead frame blank is stamped or etched from a metal strip so as to provide a die attach pad and a plurality of leads attached to the pad. Prior to separating the leads from the pad a retainer is applied to the leads adjacent the pad so that the leads are held in fixed positions during and after their separation from the pad.

7 Claims, 2 Drawing Figures

METHOD OF MAKING A LEAD FRAME

The method of making a lead frame and more particularly to making a lead frame having a central die attach pad and a plurality of leads slightly spaced from the attach pad and extending therefrom in spaced apart relationship. The conventional way of making these pads is to provide a coil of very thin strip (for example, 0.10 inches) of the desired metal such as steel, nickel or copper. The coil of metal is slit to size, may be roller leveled, and then is stamped into many lead frame blanks, each having a die attach pad a plurality of leads slightly spaced from the attach pad and extending therefrom in spaced apart relationship. If the lead frame is to be plated, it is then cleaned and plated with gold, silver or other plating material. The strip, either coated or uncoated as desired, is then cut to provide strips of one or more lead frame blanks. For example, each strip of forty lead frames may have four or six lead frame blanks.

It is necessary that the leads meet the required tolerances in spacing and co-planarity. The above operations induce additional stress into the material which already has residual metal stress from prior operations. This results in horizontal and vertical movement of the leads when separated from the attach pad. Even though extra care has been taken in the design and manufacture of the dies the lead spacing and co-planarity problems which cause lead spacing short-outs and wirebonding failures were not eliminated so that many of the lead frames did not meet specifications and had to be discarded or repaired. Much effort and expense has been directed to solving this problem, but without success.

Typically, in conventional manufacture the person in charge of set-up of the die had to make many and frequent adjustments of the die to keep the part in tolerance due to material variations, e.g., stresses, with the result that total production per unit time was relatively limited as contrasted production by the practice invention. Moreover, tolerance of conventional material was very variable because it was virtually impossible to achieve co-planarity and lead spacing to blue print tolerances. With the present invention, production per unit time is significantly increased by eliminating the need for continual die adjustment and down-time of the equipment. In addition, products produced in accordance with the invention conforms essentially completely to the blue print tolerance. Although taping has been suggested for corrective co-planarity, these efforts did not improve lead spacing or avoid the need for many and frequent die adjustments.

I have found that the problems of the prior art can be greatly reduced by maintaining an integral connection between the leads and the die attach pad until final processing. Leaving these leads attached through all secondary handling stations prevents the physical demeaning of leads which is certainly a cause of loss of lead spacing and co-planarity. Then by applying a retainer to the leads adjacent the die attach pad prior to detaching the leads from the die attach pad, the leads will be prevented from moving either vertically or horizontally. The attach pad may remain on the finished lead frame, but in some instances is removed.

It is therefore an object of my invention to provide a method of making a lead frame in which the lead tips are maintained in co-planarity and correct spacing.

Another object is to provide such a method which can be used without major changes in the standard method of manufacture.

Still another object is to provide such a method which is simple and relatively inexpensive.

Figure 2:
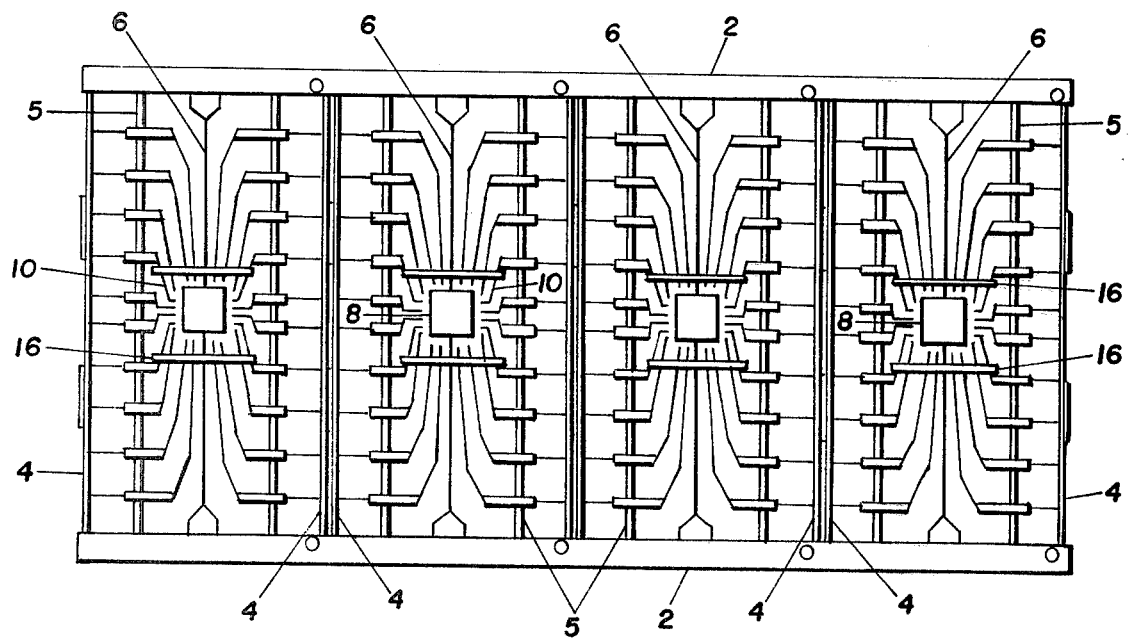

These and other objects will be more apparent after referring to the following specification and attached drawings in which:

FIG. 1 is a plan view of a stamped lead frames showing them in one stage of my method; and FIG. 2 is a view, similar to FIG. 1, showing the finished lead frames prior to separation into separate frames.

Referring more particularly to the drawings, reference numeral 2 indicates the longitudinal side rails of the lead frame. These are connected by shorting bars 4, dam bars 5 and die attach pad bars 6. A central die attach pad 8 has a plurality of leads 10 attached thereto in spaced apart relationship. The leads 10 extend outwardly through the dam bars 5 to shorting bars 4. The above construction is conventional and the method of manufacture is also conventional. As set forth above a coil of rolled metal strip is rolled to gage, longitudinally slit to size, roller straightened, then etched or stamped as shown, then plated when desired and finally cut into strips as shown in the drawings.

According to my invention, I do not separate the leads from the pad when the lead frame is initially blanked or before plating as is done in the conventional way but instead start with the stamped lead frame of FIG. 1. I apply a retainer 16 to the leads 10 adjacent to the pad 8. As shown in the drawing the leads extend from the pad 8 in two directions to provide two sets one toward each side rail 2 and a retainer 16 is associated with each set. For example, the retainers may be a high temperature tape each located about 0.300 inch from the center of the pad 8. Each retainer is attached to each of the leads associated therewith. After the retainer is applied the leads are separated from the pad. The retainer material is immaterial, but it must hold the leads in their spaced apart and coplanar positions during and after the leads are separated from the pad as shown in FIG. 2. The retainer remains on the lead frame through subsequent operations during which time it holds the leads in their spaced apart and coplanar position.

I claim:

1. The method of making a lead frame comprising the sequential steps of:
   providing a metal strip;
   providing from said strip a lead frame blank having a die attach pad and a plurality of leads attached to said pad in spaced apart relationship and extending therefrom to other parts of said blank;
   plating said lead frame blank;
   applying retainer means to said leads adjacent said pad in spaced, noncontiguous relation to the latter for holding the leads in position when they are separated from said attach pad; and
   subsequently separating said leads from said attach pad.

2. The method of claim 1 in which the die attach pad is centrally located and leads extend therefrom in two directions to provide two sets of leads, and said retainer means includes two retainers, one applied to each set.

3. The method of claim 1 in which said retainer is a high temperature tape.

4. The method of claim 3 in which the die attach pad is centrally located and leads extend therefrom in two directions to provide two sets of leads, and said retainer means includes two retainers, one applied to each set.

5. The method of claim 1 in which said strip includes a plurality of lead frame blanks each having a die attach pad and a plurality of leads attached to said pad in spaced apart relationship and extending therefrom to other parts of said blank, and said method includes applying retainer means to said leads adjacent each of said attach pads to hold them in position when said leads are separated from said attach pad, and then separating said leads from their associated attach pads.

6. The method of claim 5 in which the die attach pads are centrally located in their associated lead frame, with leads extending from each die attach pad in two directions to provide two sets of leads, and said retainer means includes a retainer applied to each set of leads.

7. the method according to claim 1 wherein said attach pad is removed.

* * * * *